United States Patent [19]

Ashmore, Jr.

[11] Patent Number: 4,829,203
[45] Date of Patent: May 9, 1989

[54] INTEGRATED PROGRAMMABLE BIT CIRCUIT WITH MINIMAL POWER REQUIREMENT

[75] Inventor: Benjamin H. Ashmore, Jr., Houston, Tex.

[73] Assignee: Texas Instruments Incorporated, Dallas, Tex.

[21] Appl. No.: 183,957

[22] Filed: Apr. 20, 1988

[51] Int. Cl.$^4$ ............................................. G11C 11/40
[52] U.S. Cl. .................................... 307/469; 307/451; 307/465; 365/185; 365/189.05; 365/189.08
[58] Field of Search ............... 307/448, 450, 451, 465, 307/468–469, 579, 585, 362, 530; 357/235, 42; 364/716; 365/184–185, 104, 189

[56] References Cited

U.S. PATENT DOCUMENTS

| | | | |
|---|---|---|---|
| 4,132,904 | 1/1979 | Harari | 357/23.5 X |
| 4,574,273 | 3/1986 | Atsumi et al. | 307/451 X |
| 4,596,938 | 6/1986 | Cartwright, Jr. | 307/451 X |
| 4,663,740 | 5/1987 | Ebel | 365/189 X |
| 4,686,558 | 8/1987 | Adam | 357/42 |
| 4,720,816 | 1/1988 | Matsuoka et al. | 365/104 X |
| 4,761,764 | 8/1988 | Watanabe | 365/189 X |

Primary Examiner—David Hudspeth
Attorney, Agent, or Firm—Theodore D. Lindgren

[57] ABSTRACT

A zero-power programmable bit circuit comprised of a programmable-inverter means with an isolation transistor and with an inverter-buffer. The programmable-inverter means is includes at least one enhancement-mode transistor pair with common floating gates and includes a diode-connected transistor. The isolation transistor protects the inverter-buffer from programming voltages. The inverter-buffer may be comprised of an inverter with a feedback transistor.

10 Claims, 2 Drawing Sheets

INTEGRATED PROGRAMMABLE BIT CIRCUIT WITH MINIMAL POWER REQUIREMENT

BACKGROUND OF THE INVENTION

This invention relates to a bit circuit for use in programmable logic arrays formed on integrated-circuit chips and, in particular, to what is commonly known as a "zero-power" bit circuit formed using complementary-metal-oxide-semiconductor (CMOS) processes.

Known previous attempts at constructing zero-power bit circuits in integrated form have utilized either cross-coupled inverters with stable states skewed by capacitors connected to power sources or have utilized CMOS technology related to electrically-erasable-programmable-read-only-memory (EEPROM) devices. Bit circuits using cross-coupled inverters depend upon well-controlled power-up sequences for proper initialization of the circuit at the time the power source is connected and, if the bit setting is disturbed by unwanted transients occurring during operation, resetting of the bit will not occur until the next such power-up sequence is applied to the circuit. Bit circuits formed using EEPROM technology are generally limited to use in circuit designs that have EEPROM capability.

Accordingly, there is a need for a zero-power bit circuit that is compatible with existing CMOS erasable programmable read-only-memory (EPROM) processing technology and that requires no special power-up sequence of signals.

SUMMARY OF THE INVENTION

The zero-power bit circuits of this invention utilize the CMOS EPROM technology and device described in U.S. patent application No. 065,989 by Howard L. Tigelaar, entitled "Floating Gate Semiconductor Device", filed June 24 1987, and assigned to Texas Instruments Incorporated, abandoned. The circuits of this invention require no special sequence of signals at the time the power supply is connected.

In a first embodiment of the invention, a P-channel, N-channel, enhancement-mode transistor pair having common floating gates and having series-connected source-drain paths is connected in series with the source-drain path of a diode-connected N-channel transistor. The transistor pair, the diode-connected transistor, and a programming transistor constitute a programmable-inverter means. An isolation transistor and an output-level-restoring inverter-buffer complete the zero-power bit circuit.

A second embodiment of the programmable-inverter means is comprised of a diode-connected transistor, a P-channel and N-channel transistor pair and a N-channel and N-channel transistor pair, each pair having common floating gates.

A third embodiment of the programmable-inverter means is comprised of a diode-connected transistor and a P-channel, N-channel, N-channel transistor trio having common floating gates.

BRIEF DESCRIPTION OF THE DRAWINGS

The novel features of this invention are set forth in the appended claims. The invention, its features, and its advantages are described below in conjunction with the following drawings:

Figure 1:
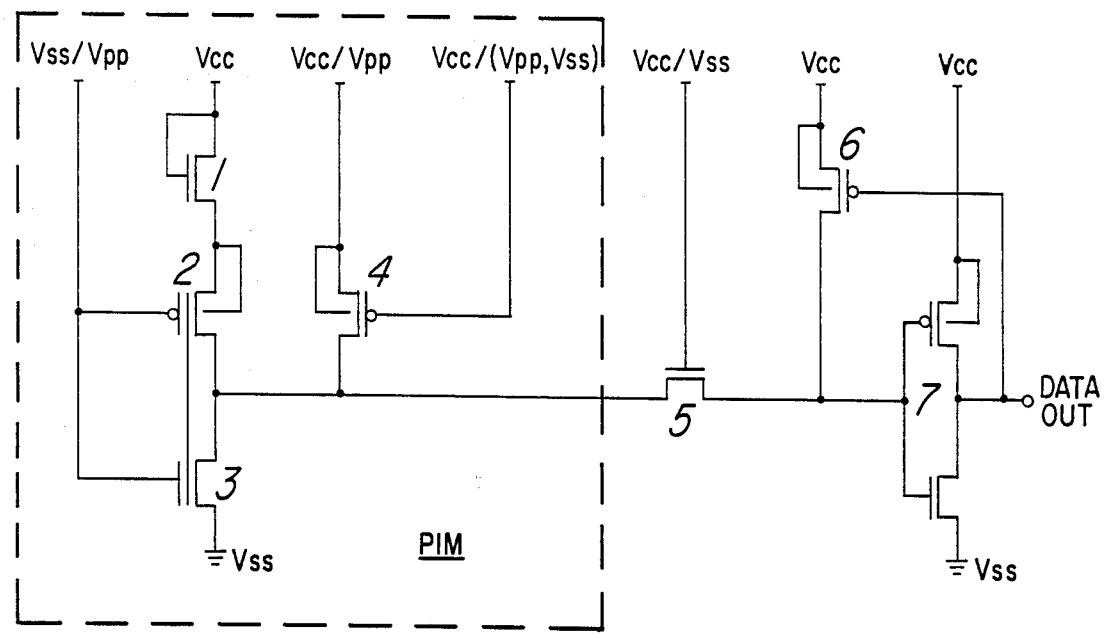
FIG. 1 is a circuit diagram of a first embodiment of this invention in which the programmable-inverter means is comprised in part of a transistor pair having common floating gates and of a programming transistor.

DETAILED DESCRIPTION OF THE SPECIFIC EMBODIMENTS:

Referring to FIG. 1, P-channel transistor 2 and N-channel transistor 3 are of the enhancement type and the transistors of pair 2,3 have common floating gates constructed according to the teachings of U.S. patent application No. 065,989 described above. As described in that Application, the source-drain paths of transistors 2 and 3 are connected in series with the non-common source-drain terminal of transistor 3 connected to ground or other source Vss of reference voltage and with the non-common source-drain terminal of transistor 2 connected to a terminal of the source-drain path of diode-connected transistor 1. The non-common source-drain terminal of transistor 1 is connected to a supply voltage source Vcc. The gate of diode-connected transistor 1 is connected to supply voltage Vcc. The common source-drain terminal of transistors 2 and 3 is the output terminal of programmable-inverter means PIM. The programming gates of transistors 2 and 3 are connected to supply voltage Vcc during normal operation and to a programming voltage Vpp during programming or charging of the common floating gates. Transistors 2 and 3 are constructed such that the coupling ratio of the control gate to the floating gate is high.

Referring again to FIG. 1, the source-drain path of P-channel transistor 4, which comprises programming means PM, is connected between the output of programmable-inverter means PIM and a source of potential which is equal to that of supply voltage Vcc during normal operation and which is equal to that of programming voltage Vpp during programming or charging of the floating gates common to transistor pair 2,3. The gate of programming transistor 4 is connected to supply voltage Vcc during normal operation. During programming operations, the gate of programming transistor 4 is connected to ground or reference voltage Vss to enable programming and is connected to programming voltage Vpp to inhibit programming.

The source-drain path of N-channel isolating transistor 5 of FIG. 1 is connected between the output of programmable-inverter means PIM and the input to inverter-buffer means 6,7. The gate of isolating transistor 5 is connected to supply voltage source Vcc during normal operation and to ground or reference voltage Vss during programming.

The source-drain path of P-channel feedback transistor 6 is connected between supply voltage source Vcc and the input of inverter-buffer 6,7. The gate of transistor 6 is connected to the output DATA OUT of inverter-buffer means 6,7, which provides the data output of the zero-power bit circuit of this invention during read or non-programming operation. Inverter 7 is comprised of P-channel transistor 7a and N-channel transistor 7b with source-drain paths connected in series between supply voltage source Vcc and ground or reference potential source Vss. The common source-drain terminal of transistors 7a and 7b is the output terminal of inverter 7. The gates of transistor 7a and 7b are connected to the input of inverter 7.

During read operation of the circuit of FIG. 1 and with no charge on the common floating gate of transistor pair 2,3, transistor 3 will be conductive and transistor 2 will be nonconductive. Diode-connected transistor 1 provides a voltage drop to the source of transistor 2, further improving the nonconductive biasing margin of transistor 2. Transistor 6 and inverter 7 form level-restoring, inverter-buffer means 6,7 for transforming the output of programmable-inverter means PIM to a usable signal. Isolating transistor 5 isolates transistor pair 2,3 from the supply voltage Vcc transmitted through transistor 6 and isolates inverter-buffer means 6,7 from programming voltages. With charge on the common floating gates of transistor pair 2,3, transistor 2 will be conductive and transistor 3 will be nonconductive.

Figure 2:
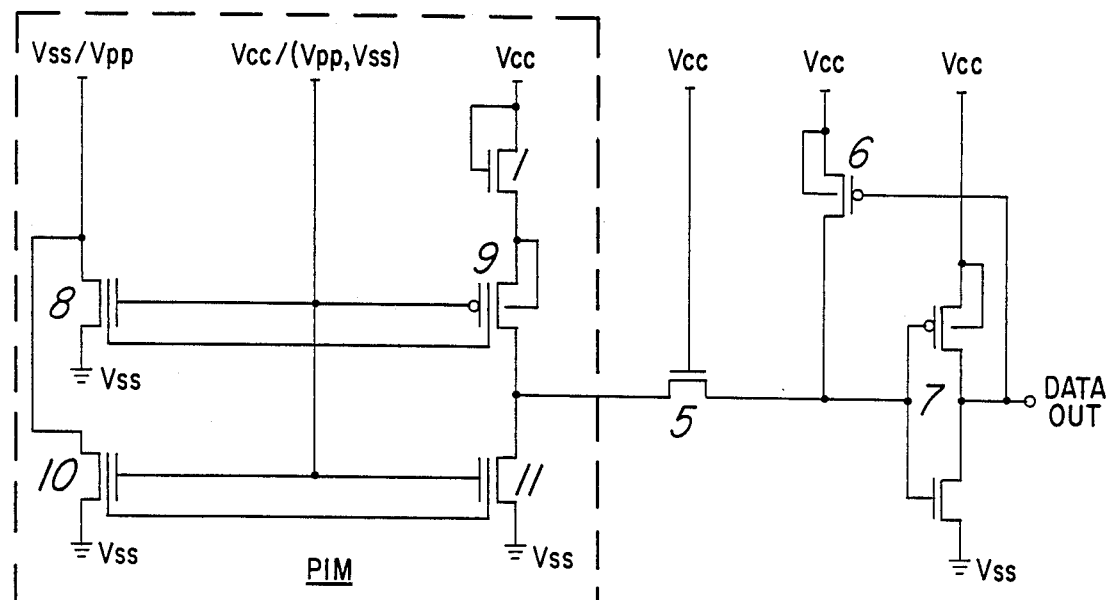
FIG. 2 is a circuit diagram illustrating a second embodiment of the programmable-inverter means of this invention, in which the programmable-inverter means is comprised in part of two pairs of transistors, each pair having common floating gates.

Referring to FIG. 2, programmable-inverter means PIM is comprised in part of N-channel transistors 8, 10 and 11 and of P-channel transistor 9. The transistors of first pair 8,9 have common floating gates, as do the transistors of second pair Transistors 8-11 are enhancement-mode type. Transistor pair 10,11 comprises programming means PM of programmable-inverter means PIM. The programming gates of transistors 8-11 are connected to supply voltage Vcc during normal operation and, during programming, to voltage source Vpp or reference potential Vss. The source-drain paths of transistors 9 and 11 are connected in series between diode-connected transistor 1 and ground or reference voltage Vss. The output of programmable-inverter means PIM is taken from the common source-drain terminal of transistors 9 and 11. The source-drain paths of transistors 8 and 10 are connected in parallel to ground or reference voltage Vss during normal operation and are connected between programming voltage Vpp and ground or reference voltage Vss during programming. With no charge on the floating gates, transistor 9 will be nonconductive and transistor 11 will be conductive during read operation. With the floating gates programmed or charged, transistor 9 will be conductive and transistor 11 will be nonconductive during read operation. Other elements of the circuit of FIG. 2 perform functions similar to identically numbered elements in FIG. 1. The gate of isolation transistor 5 may remain biased at supply voltage Vcc during programming.

Figure 3:
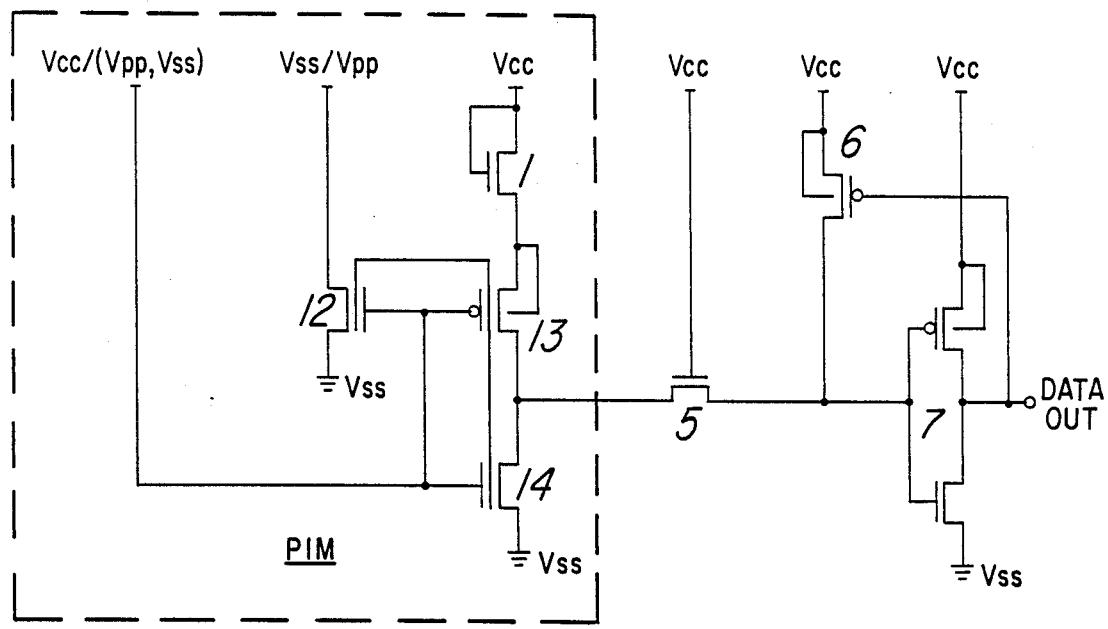
FIG. 3 is a circuit diagram illustrating a variation of the programmable-inverter means of FIG. 2 in which the programmable-inverter means is comprised in part of three transistors having common floating gates.

Referring to FIG. 3, programmable-inverting means PIM is a variation of the programmable-inverting means PIM of FIG. 2 and is comprised in part of first N-channel transistor 14, P-channel transistor 13, and second N-channel transistor 12, the three transistors having common floating gates. Transistor 12 comprises programming means PM of programmable inverter means PIM. Transistors 12-14 are enhancement-mode type. The programming gates of transistor trio 12-14 are connected to source voltage Vcc during normal operation and are connected to programming voltage Vpp or to reference voltage Vss during programming. The source-drain paths of transistors 13 and 14 are connected in series between diode-connected transistor 1 and ground or reference voltage Vss. The output of programmable-inverter means PIM is taken from the common source-drain terminal of transistors 13 and 14. Both terminals of the source-drain path of transistor 12 are connected to ground or reference voltage Vss during normal read operation and, during programming, the source-drain path of transistor 12 is connected between programming voltage Vpp and ground or reference voltage Vss. With no charge on the common floating gates, transistor 13 will be nonconductive and transistor 14 will be conductive during read operation. With the common gates charged or programmed, transistor 13 will be conductive and transistor 14 will be nonconductive during read operation.

While this invention has been described with respect to illustrative embodiments, this description is not intended to be construed in a limiting sense. Upon reference to this description, various modifications of the illustrative embodiments, as well as other embodiments of the invention, will be apparent to persons skilled in the art. It is contemplated that the appended claims will cover any such modifications or embodiments that fall within the scope of the invention.

I claim:

1. A programmable bit circuit comprising:
    a programmable-inverter means connected to a supply voltage source, connected to a reference voltage source, and, during programming, connected to a programming voltage source;
    an isolation transistor connected to the output of said programmable-inverter means; and
    an inverter-buffer means connected between the output of said isolation transistor and the output of said programmable bit circuit;
    wherein said programmable inverter means includes at least one enhancement-mode transistor pair having common floating gates; and
    wherein said inverter-buffer means includes an inverter with connected feedback transistor.

2. The programmable bit circuit of claim 1 in which said programmable-inverter means is further comprised of:
    a diode-connected transistor with channel of a first impurity type and with source-drain path connected between said supply voltage source and the series-connected source-drain paths of said transistor pair and with gate connected to said supply voltage source; and
    a programming transistor with channel of a second impurity type and with source-drain path connected between the common source-drain terminal of said series-connected transistor pair and one of said programming and supply voltage sources and with gate terminal connected to one of said programming, supply, and reference voltage sources;
    wherein a source-drain terminal of a second-impurity-type-channel transistor of said series-connected transistor pair is connected nearest said diode-connected transistor, a source-drain terminal of a first-impurity-type-channel transistor of said series-connected pair is connected to said source of reference voltage, and the programming gates of said series transistor pair are connected to one of said programming and supply voltage sources;
    wherein the output of said programmable-inverter means is the common source-drain terminal of said series-connected pair and is connected to a second-impurity-type-channel source-drain path of said isolation transistor; and
    wherein the gate of said isolation transistor is connected to one of said programming and supply voltage sources.

3. The programmable bit circuit of claim 1 in which said programmable-inverter means is further comprised of:

first and second of said enhancement-mode transistor pairs comprising a first pair of opposite impurity-type channels and a second pair of same-first-impurity-type channels; and a first-type-impurity-channel, diode-connected transistor with source-drain path connected between said supply voltage source and a source-drain terminal of the second-impurity-type-channel transistor of said first pair and with gate connected to said supply voltage source;

wherein the programming gates of said transistor pairs are each connected to one of said programming, supply, and reference voltage sources;

wherein the source-drain path of said second-impurity-type-channel transistor of said first pair is connected in series with the source-drain path of one of the transistors of said second pair, the common terminal of said series connection being the output terminal of said programmable inverter means and the other source-drain terminal of said one transistor being connected to said reference voltage source; and wherein the source-drain path of said first-impurity-type-channel transistor of said first pair is connected in parallel with the source-drain path of the other transistor of said second pair and one of said parallel-connected source-drain terminals is connected to said reference voltage source and the other of said parallel-connected source-drain terminals is connected to one of said programming and said reference voltage sources.

4. The programmable bit circuit of claim 1 in which said programmable-inverter means is further comprised of:

a third enhancement-mode transistor having a common floating gate with said transistor pair, said three-transistor trio comprising a first and a second first-impurity-type-channel transistor and one second-impurity-type-channel transistor; and a first-impurity-type-channel diode-connected transistor with source-drain path connected between said supply voltage source and a source-drain terminal of said second-impurity-type-channel transistor of said trio and with gate connected to said supply voltage source;

wherein the programming gates of said transistor trio are each connected to one of said programming, supply and reference voltage sources;

wherein the source-drain path of said second-impurity-type-channel transistor of said trio is connected in series with the source-drain path of said first first-impurity-type-channel transistor, the common terminal of said series connection being the output terminal of said programmable-inverter means and the other source-drain terminal of said first first-impurity-type-channel transistor being connected to said reference voltage source; and wherein the source-drain path of said second first-impurity-type-channel transistor is connected between said reference voltage source and one of said programming and supply voltage sources.

5. The programmable bit circuit of claim 1 in which said isolation transistor is a first-impurity-type-channel transistor with source-drain path connected between the output of said programmable-inverter means and the input of said inverter-buffer means and with gate connected to said supply voltage source.

6. The programmable bit circuit of claim 1 in which said inverter-buffer means is comprised of an inverter with an inverter input and an inverter output and in which said feedback transistor is a second-impurity-type-channel transistor with source-drain path connected between said inverter input and said supply voltage source and with gate connected to said inverter output.

7. A programmable-inverter circuit comprised of:

an enhancement transistor pair having opposite impurity-type channels and having common floating gates, a first-impurity-type-channel diode-connected transistor, and a programming means;

wherein the source-drain paths of a second-impurity-type-channel transistor and of said diode-connected transistor are connected in series between a supply voltage source and the output of said programmable-inverter circuit;

wherein the source-drain path of a first-impurity-type-channel transistor of said transistor pair is connected to a source of reference potential;

wherein the programming gates of said second-impurity-type-channel transistor and of said first-impurity-type-channel transistor of said transistor pair are connected to said supply voltage source during operation and to one of a programming voltage source or said source of reference potential during programming;

wherein said programming means is connected to said supply voltage source during operation and to said programming voltage source during programming and causes avalanche injection of charges into said common floating gates during connection to said programming voltage; and wherein the source-drain path of said first-impurity-type-channel transistor of said transistor pair is connected to allow said avalanche injection.

8. The programmable-inverter circuit of claim 7 wherein said programming means comprises a second-impurity-type-channel transistor with source-drain path connected between one of said voltage sources and said output terminal of said circuit and with gate connected to said supply voltage source during operation and to one of said source of reference potential or said programming voltage source during programming and wherein the source-drain path of said first-impurity-type-channel transistor of said transistor pair is connected between said output terminal of said circuit and said source of reference potential.

9. The programmable-inverter circuit of claim 7 wherein said programming means comprises a pair of first-impurity-type-channel transistors with common floating gates, wherein the programming gates of said first-impurity-type-channel pair are connected to the programming gates of said transistor pair having opposite impurity-type channels, wherein the source-drain paths of a first-impurity-type-channel transistor of each of said pairs are connected in parallel between said voltage sources and said source of reference potential, and wherein the source-drain path of a transistor of said pair of first-impurity-type-channel transistors is connected between said output terminal of said circuit and said source of reference potential.

10. The programmable-inverter circuit of claim 7 wherein said programming means is comprised of a second first-impurity-type-channel transistor having a common floating gate with said pair having opposite impurity-type channels, wherein the source-drain path of said second first-impurity-type-channel transistor is connected between one of said voltage sources and said source of reference potential, wherein the programming gate of said second first-impurity-type-channel transistor is connected to the programming gates of said transistor pair having opposite impurity-type channels, and wherein the source-drain path of said first-impurity-type-channel transistor of said transistor pair having opposite impurity-type channels is connected between said output terminal and said source of reference potential.

* * * * *